United States Patent
Kotani et al.

(10) Patent No.: US 10,199,483 B2
(45) Date of Patent: Feb. 5, 2019

(54) SEMICONDUCTOR DEVICE

(71) Applicant: SHINDENGEN ELECTRIC MANUFACTURING CO., LTD., Tokyo (JP)

(72) Inventors: Ryohei Kotani, Hanno (JP); Toshiki Matsubara, Hanno (JP); Nobutaka Ishizuka, Hanno (JP); Masato Mikawa, Hanno (JP); Hiroshi Oshino, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/540,823

(22) PCT Filed: May 26, 2016

(86) PCT No.: PCT/JP2016/065645
§ 371 (c)(1),
(2) Date: Jun. 29, 2017

(87) PCT Pub. No.: WO2017/203671
PCT Pub. Date: Nov. 30, 2017

(65) Prior Publication Data
US 2018/0204935 A1    Jul. 19, 2018

(51) Int. Cl.
*H01L 29/739*    (2006.01)
*H01L 27/02*    (2006.01)
(Continued)

(52) U.S. Cl.
CPC ...... *H01L 29/7395* (2013.01); *H01L 27/0255* (2013.01); *H01L 29/0619* (2013.01);
(Continued)

(58) Field of Classification Search
None
See application file for complete search history.

(56) References Cited

U.S. PATENT DOCUMENTS 4,614,959 A    9/1986  Nakagawa
5,589,408 A *  12/1996 Robb .................. H01L 29/0834
                                                    257/E29.037
(Continued)

FOREIGN PATENT DOCUMENTS

EP    0 566 179 A1    10/1993
JP    56-083076 A     7/1981
(Continued)

OTHER PUBLICATIONS

Jung, Eun Sik , Kyoung, Sin-su , Chung, Hunsuk , and Kang, Ey Goo , "A Study of Field-Ring Design using a Variety of Analysis Method in Insulated Gate Bipolar Transistor (IGBT)." Journal of Electrical Engineering and Technology 6 No. 6 () Nov. 2014): http://dx.doi.org/10.5370/JEET.2014.9.6.1995.*
(Continued)

*Primary Examiner* — Joseph Schoenholtz
(74) *Attorney, Agent, or Firm* — Nutter McClennen & Fish LLP

(57) ABSTRACT

In a semiconductor device according to an embodiment, ends of conductor portions are electrically connected to an overvoltage protection diode so that depletion occurs in a diffusion layer in a portion near an insulating film in a reverse bias application state, and/or ends of conductor portions are electrically connected to the overvoltage protection diode so that depletion occurs in a peripheral semiconductor region in a portion near the insulating film in the reverse bias application state.

12 Claims, 6 Drawing Sheets

(51) Int. Cl.
  *H01L 29/40* (2006.01)
  *H01L 29/78* (2006.01)
  *H01L 29/08* (2006.01)
  *H01L 29/06* (2006.01)
  *H01L 29/866* (2006.01)
  *H01L 29/16* (2006.01)
  *H01L 29/47* (2006.01)

(52) U.S. Cl.
  CPC ...... *H01L 29/0638* (2013.01); *H01L 29/0834* (2013.01); *H01L 29/16* (2013.01); *H01L 29/404* (2013.01); *H01L 29/405* (2013.01); *H01L 29/7802* (2013.01); *H01L 29/7804* (2013.01); *H01L 29/7808* (2013.01); *H01L 29/7811* (2013.01); *H01L 29/866* (2013.01); *H01L 29/47* (2013.01)

(56) References Cited

U.S. PATENT DOCUMENTS

| | | | |
|---|---|---|---|
| 6,762,440 | B1 | 7/2004 | Pairitsch et al. |
| 8,018,028 | B2* | 9/2011 | Miyajima ............. H01L 29/866 257/551 |
| 9,406,666 | B2 | 8/2016 | Naito |
| 2003/0107102 | A1* | 6/2003 | Ozeki ................... H01L 29/404 257/487 |
| 2005/0161761 | A1* | 7/2005 | Hatade ................. H01L 27/088 257/487 |
| 2005/0167694 | A1* | 8/2005 | Takahashi ........... H01L 29/0696 257/127 |
| 2008/0173935 | A1 | 7/2008 | Miyajima |
| 2014/0209973 | A1* | 7/2014 | Laven .................... H01L 21/04 257/155 |
| 2015/0340356 | A1* | 11/2015 | Naito .................... H01L 29/405 257/49 |
| 2017/0229551 | A1* | 8/2017 | Nakanishi ............. H01L 29/063 |

FOREIGN PATENT DOCUMENTS

| | | |
|---|---|---|
| JP | 2003-188381 A | 7/2003 |
| JP | 2004-296819 A | 10/2004 |
| JP | 2005-217152 A | 8/2005 |
| JP | 2009-111304 A | 5/2009 |
| JP | 2014-187071 A | 10/2014 |
| WO | 2014/142331 A1 | 9/2014 |

OTHER PUBLICATIONS

K. Sakurai et al., "Power MOSFETs having Schottky barrier drain contact," Power Semiconductor Devices and ICs, 1990. ISPSD '90. Proceedings of the 2nd International Symposium on, 1990, pp. 126-130. doi: 10.1109/ISPSD.1990.991072.*

Sattar, A., "Insulated Gate Bipolar Transistor (IGBT) Basics", IXAN0063, Mar. 4, 2016 downloaded from URL<https://www.ixys.com/Documents/AppNotes/IXYS_IGBT_Basic_I.pdf> on May 11, 2018.*

International Preliminary Report on Patentability for Application No. PCT/JP2016/065645, dated Nov. 29, 2018 (with Engl. translation) 19 pages.

* cited by examiner

SEMICONDUCTOR DEVICE

The present application claims priority under 35 U.S.C. § 365 to PCT/JP2016/065645, filed on May 26, 2016, the disclosure of which are incorporated herein by reference.

TECHNICAL FIELD

The present invention relates to semiconductor devices.

BACKGROUND ART

Semiconductor devices with a so-called MOS ("Metal-Oxide-Semiconductor") structure have conventionally been known. The semiconductor devices with the MOS structure (hereinafter referred to as "MOS-type semiconductor devices") include, for example, IGBTs ("Insulated Gate Bipolar Transistors") and MOSFETs ("MOS Field Effect Transistors").

Conventional MOS-type semiconductor devices include series-connected Zener diodes provided as overvoltage protection measures. Specifically, a Zener diode that is designed to break down at a voltage lower than the breakdown voltage of an MOS-type semiconductor device is disposed between the collector and the gate of the MOS-type semiconductor device (for example, see Patent Literature 1).

In order to ensure a breakdown voltage, the MOS-type semiconductor device has a voltage supporting region in a peripheral portion of a semiconductor substrate, and a conductor portion (which is called "field plate") is disposed along the voltage supporting region. The conductor portion is disposed on an insulating film located on the semiconductor substrate. This stabilizes the surface potential of the voltage supporting region to improve the reliability of the semiconductor device.

CITATION LIST

Patent Literature

[Patent Literature 1] Japanese Patent Laid-Open No. 2009-111304

SUMMARY OF INVENTION

Technical Problem

The insulating film such as a silicon oxide film that is disposed between the conductor portion and the semiconductor substrate in the aforementioned semiconductor device includes mobile ions such as Na ions. Therefore, if, for example, the collector electrode of an IGBT is connected to a high potential and the emitter electrode is connected to the ground, the breakdown voltage of the semiconductor device may be locally reduced due to the movement of the mobile ions in the insulating film.

Under the circumstances, the object of the present invention is to provide a semiconductor device capable of inhibiting the reduction in the breakdown voltage and improving the reliability.

Solution to Problem

In a semiconductor device according to the present invention, the one principal surface of the semiconductor substrate includes an active region, and a voltage supporting region surrounding the active region and including a peripheral portion of the semiconductor substrate, the semiconductor device including:

a diffusion layer of a second conductive type selectively formed on the one principal surface in the voltage supporting region, and surrounding the active region;

an insulating film formed on the diffusion layer, and on a peripheral semiconductor region of a first conductive type disposed outside the diffusion layer;

an overvoltage protection diode including semiconductor layers of the first conductive type and semiconductor layers of the second conductive type alternately disposed on the insulating film from the active region side toward the peripheral portion of the semiconductor substrate; and a first conductor portion and a second conductor portion formed on the insulating film along the voltage supporting region, the first conductor portion being disposed above the diffusion layer with the insulating film being disposed therebetween, and the second conductor portion being disposed above the peripheral semiconductor region with the insulating film being disposed therebetween, an end of the first conductor portion being electrically connected to the overvoltage protection diode so that depletion occurs in the diffusion layer in a portion near the insulating film in a reverse bias application state, and/or an end of the second conductor portion being electrically connected to the overvoltage protection diode so that depletion occurs in the peripheral semiconductor region in a portion near the insulating film in the reverse bias application state.

In the semiconductor device, the first conductive type may be n-type and the second conductive type may be p-type, the end of the first conductor portion may be electrically connected to a first portion of a side surface of the overvoltage protection diode so that a potential of the first conductor portion is higher than a potential of the diffusion layer immediately below the first conductor portion in the reverse bias application state, and the end of the second conductor portion may be electrically connected to a second portion of the side surface of the overvoltage protection diode so that a potential of the second conductor portion is lower than a potential of the peripheral semiconductor region immediately below the second conductor portion in the reverse bias application state.

In the semiconductor device, the first conductor portion may include:

a first conductor forming portion extending along the peripheral portion of the semiconductor substrate;

a second conductor forming portion extending to be close to the overvoltage protection diode, one end of the second conductor forming portion being connected to the first conductor forming portion; and a third conductor forming portion electrically connecting the second conductor forming portion and the overvoltage protection diode, the second conductor forming portion being wider than the first conductor forming portion, and the third conductor forming portion being narrower than a width at another end of the second conductor forming portion, and being disposed to shift toward a side end of the semiconductor substrate.

In the semiconductor device, a first conductor forming portion extending along the peripheral portion of the semiconductor substrate;

a second conductor forming portion extending to be close to the overvoltage protection diode, one end of the second conductor forming portion being connected to the first conductor forming portion; and a third conductor forming portion electrically connecting the second conductor forming portion and the overvoltage protection diode, the second conductor forming portion being wider than the first conductor forming portion, and the third conductor forming portion being narrower than a width at another end of the second conductor forming portion, and being disposed to shift toward an active region side.

In the semiconductor device, the second conductor forming portion may increase in width toward the overvoltage protection diode.

In the semiconductor device, the first conductive type may be p-type, and the second conductive type may be n-type, the end of the first conductor portion may be electrically connected to a first portion on a side surface of the overvoltage protection diode so that a potential of the first conductor portion is lower than a potential of the diffusion layer immediately below the first conductor portion in the reverse bias application state, and the end of the second conductor portion may be electrically connected to a second portion of the side surface of the overvoltage protection diode so that a potential of the second conductor portion is higher than a potential of the peripheral semiconductor region immediately below the second conductor portion in the reverse bias application state.

In the semiconductor device, the first conductor portion may include:

a first conductor forming portion extending along the peripheral portion of the semiconductor substrate;

a second conductor forming portion extending to be close to the overvoltage protection diode, one end of the second conductor forming portion being connected to the first conductor forming portion; and a third conductor forming portion electrically connecting the second conductor forming portion and the overvoltage protection diode, the second conductor forming portion being wider than the first conductor forming portion, and the third conductor forming portion being narrower than a width at another end of the second conductor forming portion, and being disposed to shift toward an active region side.

In the semiconductor device, the second conductor portion may include:

a first conductor forming portion extending along the peripheral portion of the semiconductor substrate;

a second conductor forming portion extending to be close to the overvoltage protection diode, one end of the second conductor forming portion being connected to the first conductor forming portion; and a third conductor forming portion electrically connecting the second conductor forming portion and the overvoltage protection diode, the second conductor forming portion being wider than the first conductor forming portion, and the third conductor forming portion being narrower than a width at another end of the second conductor forming portion, and being disposed to shift toward a side end of the semiconductor substrate.

In the semiconductor device, the second conductor forming portion may increase in width toward the overvoltage protection diode.

In the semiconductor device, the semiconductor substrate may be a silicon substrate, and the insulating film may be a silicon oxide film.

In the semiconductor device, the first conductor portion and/or the second conductor portion may be connected to the overvoltage protection diode over a connection boundary between the semiconductor layer of the first conductive type and the semiconductor layer of the second conductive type, which are adjacent to each other.

In the semiconductor device, the semiconductor device may further include:

a diffusion region of the first conductive type formed in the diffusion layer;

an emitter electrode formed on the diffusion region;

a gate electrode formed on the overvoltage protection diode;

a collector region of the second conductive type formed on the other principal surface of the semiconductor substrate; and a collector electrode formed on the collector region.

In the semiconductor device, the semiconductor device may further include:

a diffusion region of the first conductive type formed in the diffusion layer;

an emitter electrode formed on the diffusion region;

a gate electrode formed on the overvoltage protection diode;

a drain region of the first conductive type formed on the other principal surface of the semiconductor substrate; and a collector electrode formed on the drain region to form a Schottky barrier with the drain region.

In the semiconductor device, the semiconductor device may further include:

a diffusion region of the first conductive type formed in the diffusion layer;

a source electrode formed on the diffusion region;

a gate electrode formed on the overvoltage protection diode;

a drain region of the first conductive type formed on the other principal surface of the semiconductor substrate; and a drain electrode formed on the drain region.

In the semiconductor device, the semiconductor device may further include t one or more guard rings of the second conductive type selectively formed on the one principal surface in the voltage supporting region to surround the diffusion layer.

Advantageous Effects of Invention

In the present invention, an end of a first conductor portion is electrically connected to a side surface of an overvoltage protection diode so that depletion occurs in a diffusion layer in a portion near an insulating film in a reverse bias application state, and/or an end of a second conductor portion is electrically connected to the side surface of the overvoltage protection diode so that depletion occurs in a peripheral semiconductor region in a portion near the insulating film in the reverse bias application state. This generates polarized charges in the insulating film by impurity charges in the depleted semiconductor region when a reverse bias is applied. Since mobile ions in the insulating film are trapped by the polarized charges, the movement of the mobile ions is inhibited. Therefore, according to the present invention, a reduction in the breakdown voltage is inhibited when a reverse bias is applied, and thus the reliability can be improved.

DESCRIPTION OF EMBODIMENTS

Hereinafter, semiconductor devices according to embodiments of the present invention will be described with reference to the drawings.

First Embodiment

A first embodiment of the present invention will be described. A semiconductor device 1 according to the first embodiment is an IGBT.

In the semiconductor device 1, a principal current flows between an upper surface 2a (one principal surface) and a lower surface 2b (another principal surface) of a semiconductor substrate 2. The semiconductor substrate 2 is a silicon substrate in this embodiment. The present invention, however, is not limited to this, and other semiconductor substrates (for example, SiC substrate or GaN substrate) may also be used. Although the conductive type of the semiconductor substrate 2 is n-type in this embodiment, the conductive type is not limited to the n-type.

Figure 1:
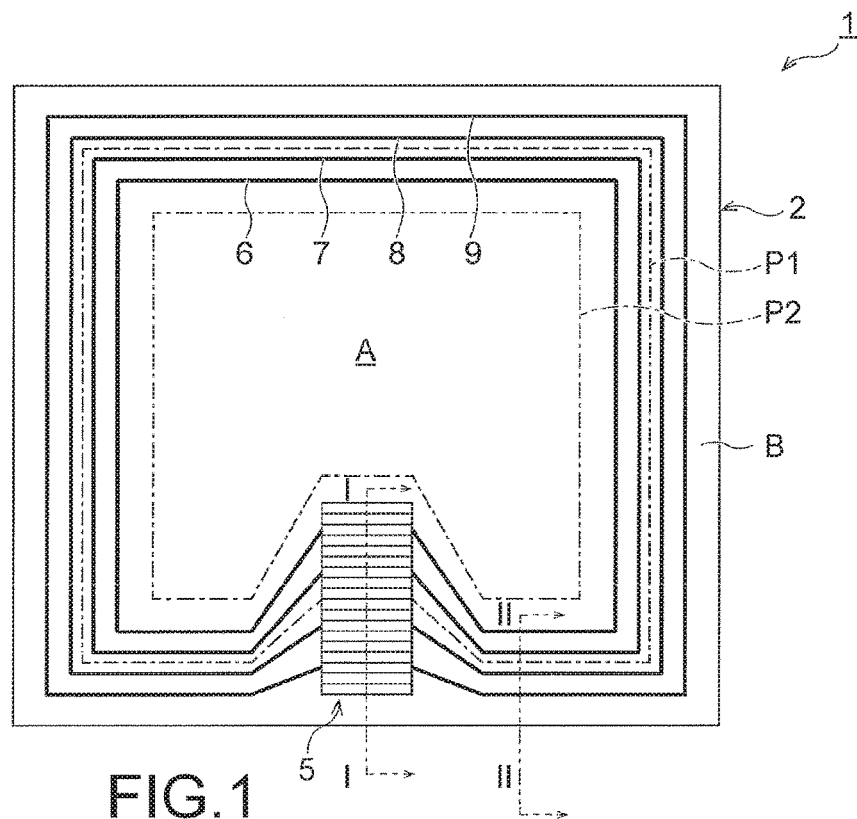
FIG. 1 is a plan view of a semiconductor device 1 (IGBT) according to a first embodiment.

FIG. 1 shows that an active region A in which the principal current flows and a voltage supporting region B surrounding the active region A are disposed on an upper surface 2a of the semiconductor substrate 2. The voltage supporting region B includes a peripheral portion of the semiconductor substrate 2. The "peripheral portion" herein means a peripheral part of the semiconductor substrate 2 including side surfaces of the semiconductor substrate 2. FIG. 1 does not show an insulating film 15, a surface protecting film 16, an emitter electrode 21, a gate electrode 22, and a stopper electrode 24.

Figure 2:
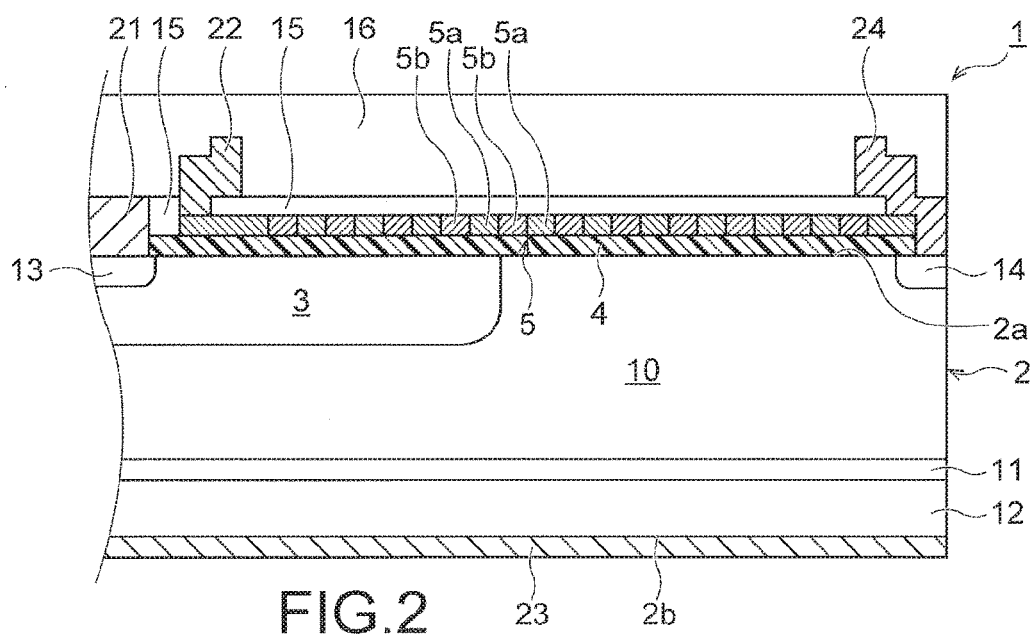
FIG. 2 is a cross-sectional view taken along line I-I of FIG. 1.
Figure 3:
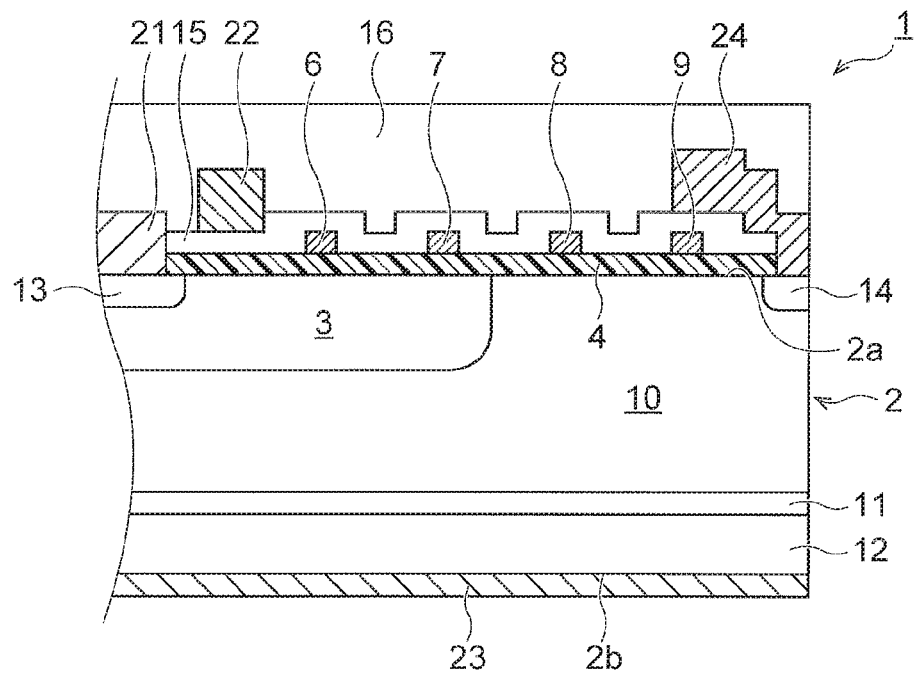
FIG. 3 is a cross-sectional view taken along line II-II of FIG. 1.

As shown in FIGS. 1 to 3, the semiconductor device 1 includes a p-type diffusion layer 3, an insulating film 4, an overvoltage protection diode 5, conductor portions 6, 7, 8, and 9, a p-type collector region 12, an n-type diffusion region 13, an n-type stopper region 14, an emitter electrode 21, a gate electrode 22, a collector electrode 23, and a stopper electrode 24. A gate pad (not shown) is disposed on the upper surface 2a of the semiconductor substrate 2.

The diffusion layer 3 is selectively formed on the upper surface 2a in the voltage supporting region B so as to surround the active region A. The diffusion layer 3 is also called "p-type base region." The region surrounded by boundaries P1 and P2 in FIG. 1 is the p-type base region. The boundary P2 is between the active region A and the voltage supporting region B. The depth of the diffusion layer 3 is, for example, 2 to 10 μm. The impurity concentration of the diffusion layer 3 is, for example, $1\times10^{14}$ cm$^{-3}$ to $1\times10^{16}$ cm$^{-3}$.

The insulating film 4 is formed on the diffusion layer 3 and a peripheral semiconductor region 10 as shown in FIG. 2. The peripheral semiconductor region 10 here is an n-type semiconductor region disposed outside the diffusion layer 3. The impurity concentration of the peripheral semiconductor region 10 is, for example, $1\times10^{13}$ cm$^{-3}$ to $1\times10^{15}$ cm$^{-3}$.

The insulating film 4 is, for example, a field oxide film. In this embodiment, the insulating film 4 is a silicon oxide film (SiO$_2$ film). The thickness of the insulating film 4 is, for example, 200 nm to 2000 nm.

The overvoltage protection diode 5 includes n-type semiconductor layers 5a and p-type semiconductor layers 5b alternately disposed on the insulating film 4 from the active region A side toward the peripheral portion of the semiconductor substrate 2 so as to be adjacent to each other. The overvoltage protection diode 5 is formed of a plurality of series connected Zener diodes.

The diffusion region 13 is an n-type semiconductor region formed in the diffusion layer 3. As shown in FIG. 2, the emitter electrode 21 is formed on the diffusion region 13. The impurity concentration of the diffusion region 13 is, for example, $1\times10^{19}$ cm$^{-3}$ to $1\times10^{21}$ cm$^{-3}$.

The n-type stopper region 14 is formed at the end of the upper surface 2a connecting to the side of the semiconductor substrate 2. The impurity concentration of the stopper region 14 is higher than that of the peripheral semiconductor region 10. The stopper electrode 24 is formed on the stopper region 14. The stopper electrode 24 is electrically connected to the other end of the overvoltage protection diode 5.

The gate electrode 22 is disposed above the diffusion layer 3 with the insulating film 4 disposed therebetween. In this embodiment, the gate electrode 22 is formed on the overvoltage protection diode 5. More specifically, the gate electrode 22 is electrically connected to one end of the overvoltage protection diode 5 on the active region A side, as shown in FIG. 2.

The p-type collector region 12 is formed on the lower surface 2b of the semiconductor substrate 2. The impurity concentration of the collector region 12 is, for example, $1\times10^{17}$ cm$^{-3}$ to $1\times10^{19}$ cm$^{-3}$. As shown in FIG. 2, the collector electrode 23 is formed on the collector region 12. An n-type buffer region 11 may be disposed on the collector region 12. The impurity concentration of the buffer region 11 is, for example, $1\times10^{16}$ cm$^{-3}$ to $1\times10^{18}$ cm$^{-3}$.

Furthermore, as shown in FIGS. 1 and 2, the semiconductor device 1 also includes an insulating film 15 covering the overvoltage protection diode 5, and a surface protecting film 16 covering the entire surface on the upper surface 2a side of the semiconductor device 1. The insulating film 15 is, for example, a BPSG (Boron Phosphorous Silicate Glass) film. The surface protecting film 16 covers the entire surface on the upper surface 2a side of the semiconductor substrate 2 as shown in FIG. 2. The surface protecting film 16 is, for example, a polyimide film.

Next, the conductor portions 6, 7, 8, and 9 disposed in the voltage supporting region B will be described in detail.

As shown in FIG. 1, the conductor portions 6 and 7 (first conductor portions) and the conductor portions 8 and 9 (second conductor portions) are formed on the insulating film 4 along the voltage supporting region B. The conductor portions 6, 7, 8, and 9 (more accurately, conductor forming portions 6a, 7a, 8a, 9a) are parallel to one another. The conductor portions 6, 7, 8, and 9 are formed of a material such as polycrystalline silicon or aluminum. The number of conductor portions is not limited to four.

As shown in FIG. 3, the conductor portions 6 and 7 are disposed above the diffusion layer 3 with the insulating film 4 disposed therebetween, and the conductor portions 8 and 9 are disposed above the peripheral semiconductor region 10 with the insulating film 4 disposed therebetween.

Figure 4:
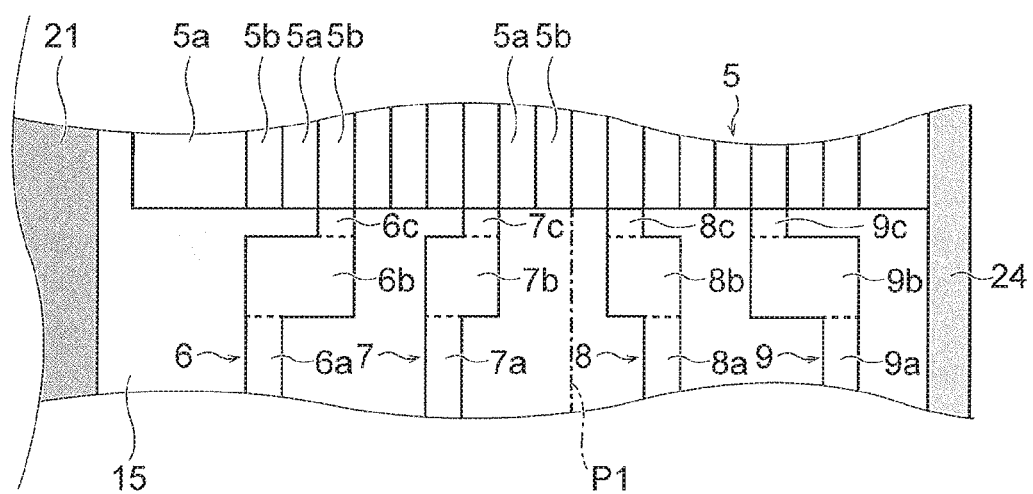
FIG. 4 is a schematic plan view of a connecting region between conductor portions 6, 7, 8, and 9 and an overvoltage protection diode 5.

As shown in FIG. 4, the conductor portions 6, 7, 8, and 9 includes the conductor forming portions 6a, 7a, 8a, and 9a (first conductor forming portions), conductor forming portions 6b, 7b, 8b, and 9b (second conductor forming portions), and conductor forming portions 6c, 7c, 8c, and 9c (third conductor forming portions). FIG. 4 is a schematic diagram used for explaining a schematic configuration of the conductor portions 6, 7, 8, and 9, and does not correspond to the plan view of FIG. 1.

The conductor forming portions 6a, 7a, 8a, and 9a of the conductor portions 6, 7, 8, and 9 extend along the peripheral portion (side end) of the semiconductor substrate 2. One end of each of the conductor forming portions 6b, 7b, 8b, and 9b is connected to the corresponding one of the conductor forming portions 6a, 7a, 8a, and 9a. The conductor forming portions 6b, 7b, 8b, and 9b extend to a region near the overvoltage protection diode 5. The conductor forming portions 6c, 7c, 8c, and 9c electrically connect the conductor forming portions 6b, 7b, 8b, and 9b and the overvoltage protection diode 5.

As shown in FIG. 4, the width of the conductor forming portions 6b, 7b, 8b, and 9b is wider than that of the conductor forming portions 6a, 7a, 8a, and 9a. The width of the conductor forming portions 6c, 7c, 8c, and 9c is narrower than that at the other end (the end at the overvoltage protection diode 5 side) of the conductor forming portions 6b, 7b, 8b, and 9b. The conductor forming portions 6c, 7c, 8c, and 9c are disposed to be shifted toward the pn junction boundary P1 between the diffusion layer 3 and the peripheral semiconductor region 10. Specifically, in FIG. 4, the conductor forming portions 6b and 7c are shifted to the right side, and the conductor forming portions 8c and 9c are shifted to the left side. More generally speaking, the conductor forming portions 6b and 7c are shifted toward the side end of the semiconductor substrate 2 (high potential side), and the conductor forming portions 8c and 9c are shifted toward the active region A side (low potential side) of the semiconductor substrate 2.

Next, the potential of each region, when the semiconductor device 1 is in the reverse bias application state, will be described with reference to FIG. 5. The "reverse bias application state" in the first embodiment means a state where the collector electrode 23 is connected to a high potential (for example, the positive electrode of a DC power supply), the emitter electrode 21 is grounded, and a low voltage that does not turn on the IGBT is applied to the gate electrode 22. The numerical values in FIG. 5 are those of an example in which a high potential, 400 V, is applied to the collector electrode 23, the emitter electrode 21 is grounded, and an OFF voltage, which is from 10 to 20 V, is applied to the gate electrode 22.

Figure 5:
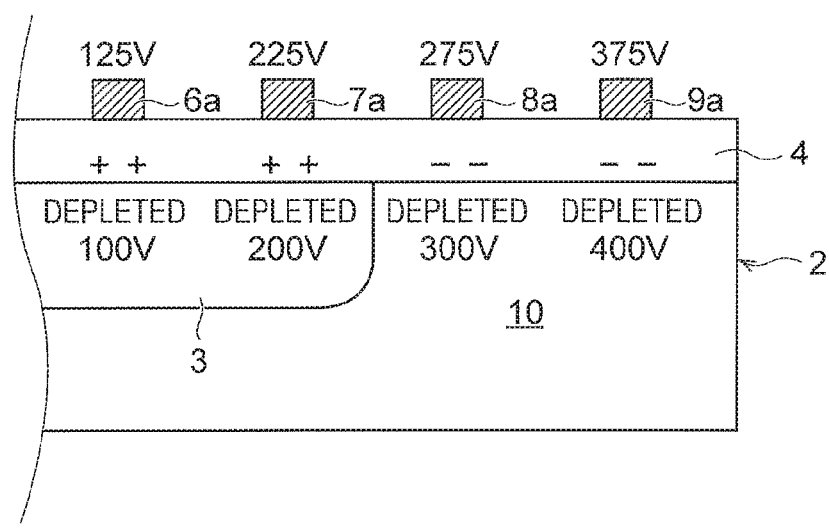
FIG. 5 is a diagram showing an example of a potential in each region in a reverse bias application state.

The ends of the conductor portions 6 and 7 are electrically connected to a side surface of the overvoltage protection diode 5 so that depletion occurs in the diffusion layer 3 in portions near the insulating film 4 in the reverse bias application state, as shown in FIG. 5. More specifically, the ends of the conductor portions 6 and 7 are electrically connected to a first portion of the side surface of the overvoltage protection diode 5 so that the potential of the conductor portions 6 and 7 is higher than the potential of the diffusion layer 3 immediately below the conductor portions 6 and 7 in the reverse bias application state. This corresponds to the configuration that the conductor forming portions 6b and 7c are shifted toward the pn junction boundary P1 side (namely high potential side).

Similarly, the ends of the conductor portions 8 and 9 are electrically connected to the side surface of the overvoltage protection diode 5 so that depletion occurs in the peripheral semiconductor region 10 in portions near the insulating film 4 in the reverse bias application state. More specifically, the ends of the conductor portions 8 and 9 are electrically connected to a second portion of the side surface of the overvoltage protection diode 5 so that the potential of the conductor portions 8 and 9 is lower than the potential of the peripheral semiconductor region 10 immediately below the conductor portions 8 and 9 in the reverse bias application state. This corresponds to the configuration that the conductor forming portions 8c and 9c are shifted toward the pn junction boundary P1 side (namely, low potential side).

The connection of the ends of the conductor portions 6, 7, 8, and 9 to the overvoltage protection diode 5 as described above generates depletion regions near the insulating film 4 as shown in FIG. 5.

Since the potential (125V) of the conductor forming portion 6a is higher than the potential (100V) of the diffusion layer 3 immediately below the conductor forming portion 6a, depletion occurs in the p-type diffusion layer 3 in a portion near the insulating film 4. Similarly, since the potential (225V) of the conductor forming portion 7a is higher than the potential (200V) of the diffusion layer 3 immediately below the conductor forming portion 7a, depletion occurs in the diffusion layer 3 in a portion near the insulating film 4. The impurity charges (namely negative charges of the acceptor) in the depleted semiconductor regions lead to positively polarized charges in the insulating film 4.

Since the potential (275V) of the conductor forming portion 8a is lower than the potential (300V) of the peripheral semiconductor region 10 immediately below the conductor forming portion 8a, depletion occurs in the n-type peripheral semiconductor region 10 in a portion near the insulating film 4. Similarly, since the potential (375V) of the conductor forming portion 9a is lower than the potential (400V) of the peripheral semiconductor region 10 immediately below the conductor forming portion 9a, depletion occurs in the peripheral semiconductor region 10 in a portion near the insulating film 4. The impurity charges (namely positive charges of the donor) in the depleted semiconductor region lead to negatively polarized charges in the insulating film 4.

Thus, the polarized charges are generated in the insulating film 4. Since the mobile ions such as Na ions in the insulating film 4 are trapped by the polarized charges, the movement of the mobile ions is restricted. As a result, the semiconductor device 1 capable of inhibiting the reduction in the breakdown voltage, and improving the reliability can be provided according to this embodiment.

As described above, the conductor portions 6 and 7 are deformed by the conductor forming portions 6b and 7b and connected to the high potential side of the overvoltage protection diode 5 (the side end side of the semiconductor substrate 2), and the conductor portions 8 and 9 are deformed by the conductor forming portions 8b and 9b and connected to the low potential side of the overvoltage protection diode 5 (the active region A side).

All of the conductor portions 6, 7, 8, and 9 do not necessarily have the above configuration. At least one of the conductor portions 6, 7, 8, and 9 may have the above configuration if need arises.

Figure 6A:
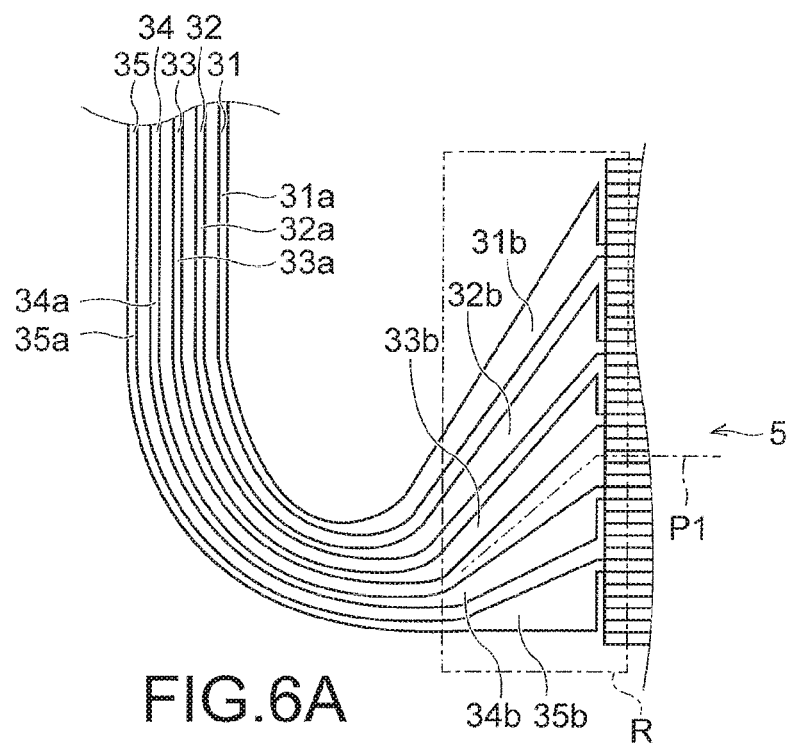
FIG. 6A is a plan view showing a part of conductor portions 31 to 35 and the overvoltage protection diode 5 according to an embodiment.

Various shapes other than that described with reference to FIG. 4 may be used for the conductor portions. For example, FIG. 6A shows five conductor portions, namely conductor portions 31, 32, and 33 (first conductor portions) and conductor portions 34 and 35 (second conductor portions). The conductor portions 31, 32, 33, 34, and 35 include conductor forming portions 31a, 32a, 33a, 34a, and 35a (first conductor forming portions), conductor forming portions 31b, 32b, 33b, 34b, and 35b (second conductor forming portions), and conductor forming portions 31c, 32c, 33c, 34c, and 35c (third conductor forming portions).

As shown in FIG. 6A, as the conductor forming portions 31b, 32b, 33b, 34b, 35b come close the overvoltage protection diode 5, they extend toward the active region A. In other words, as the conductor forming portions 31b, 32b, 33b, 34b, and 35b go away from the overvoltage protection diode 5, they extend toward the side end of the semiconductor substrate 2. As a result, the distances among the conductor forming portions 31a, 32a, 33a, 34a, 35a may be decreased to increase the area of the active region A while the depletion regions are formed in the reverse bias application state, like the example shown in FIG. 5.

The width of the conductor forming portions 31b, 32b, 33b, 34b, and 35b is designed to increase when they come close to the overvoltage protection diode 5, as shown in FIG. 6A. As a result, the potential difference in the reverse bias application state increases as the distance from the junction points in the conductor forming portion 31c, 32c, 33c, 34c, 35c increases in a direction along which the overvoltage protection diode 5 extends (the vertical direction in FIG. 6A). The potential difference is a difference in potential between the conductor portions 6 and 7 and the diffusion layer 3 immediately below the conductor portions 6 and 7, or a difference in potential in the reverse bias application state between the conductor portions 8 and 9 and the peripheral semiconductor region 10 immediately below the conductor portions 8 and 9.

Figure 6B:
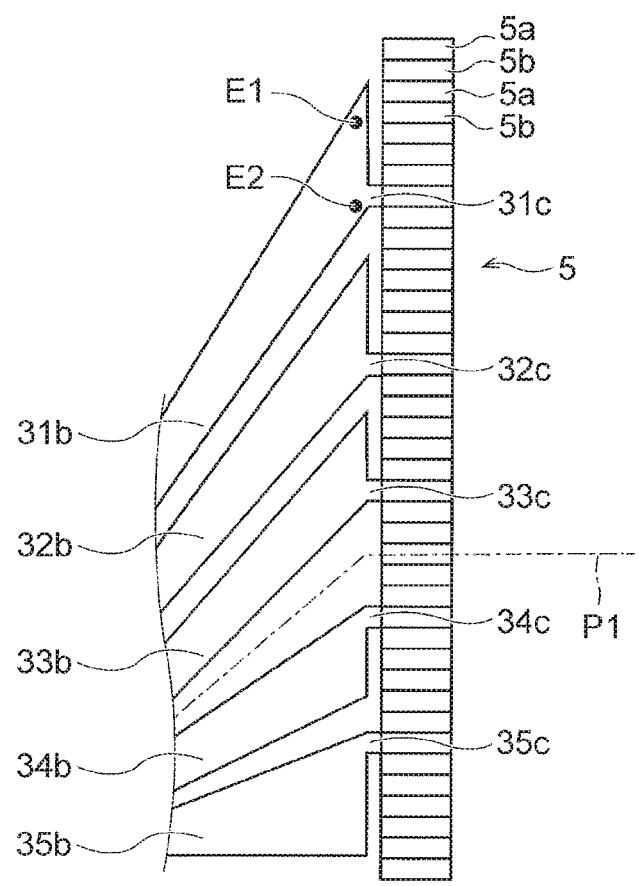
FIG. 6B is an enlarged plan view of a region R of FIG. 6A.

For example, in FIG. 6B, the potential difference at the end point E1 of the conductor forming portion 31b is greater than the potential difference at the end point E2 on the conductor forming portion 31c side. This increases the polarized charges in the insulating film 4. As a result, the movement of the mobile ions may be inhibited more effectively.

As shown in FIGS. 6A and 6B, each of the conductor forming portions 31c to 35c is connected to a semiconductor layer 5a or a semiconductor layer 5b of the overvoltage protection diode 5. For example, if the conductor forming portions 31c to 35c are formed of a semiconductor such as polycrystalline silicon, each of the conductor forming portions 31c to 35c is connected to one of the semiconductor layers 5a and 5b having the same conductive type as itself. The conductor forming portions 31c to 35c may be of different conductive types.

The conductor portions 31, 32, and 33 and/or the conductor portions 34 and 35 may be connected to the overvoltage protection diode 5 over the connection boundaries between adjacent semiconductor layers 5a and 5b. In other words, each of the conductor portions 31 to 35 may be connected to both of the semiconductor layers 5a and 5b that are adjacent to each other. Being connected over the connection boundary between adjacent semiconductor layers 5a and 5b herein not only means being connected to adjacent two semiconductor layers, but may mean being connected to adjacent three or more semiconductor layers (for example, the semiconductor layer 5a, the semiconductor layer 5b and the semiconductor layer 5a, which are adjacent to one another). Thus, depletion may occur in the surface layer portion of the semiconductor region immediately below the conductor portions 31 to 35 if at least part of the conductor portions 31 to 35 is connected to a semiconductor layer having the same conductive type as itself.

Figure 7:
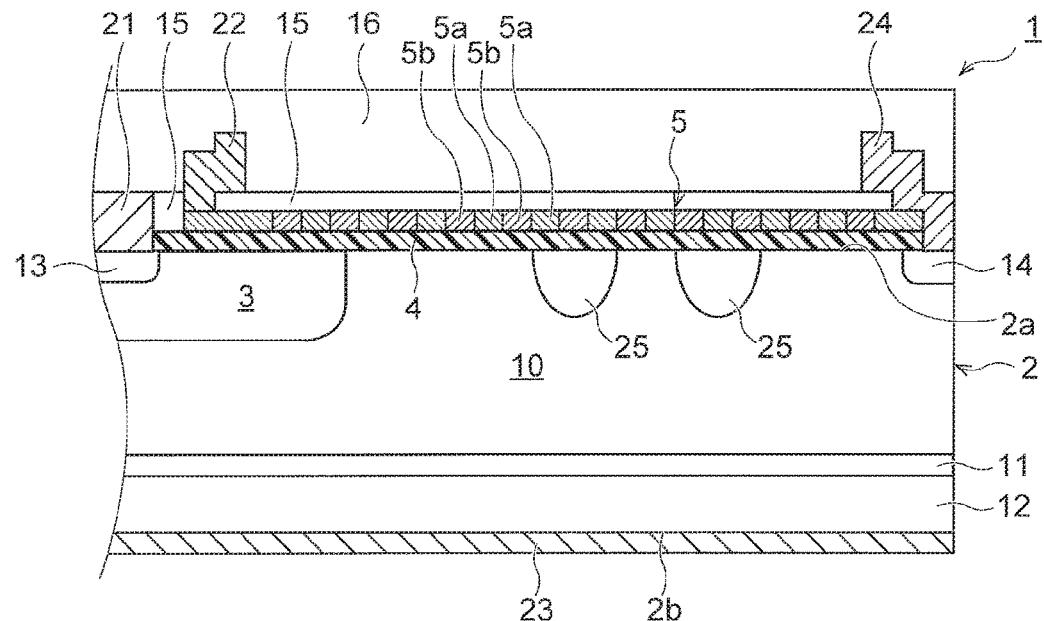
FIG. 7 is a cross-sectional view of the semiconductor device 1 including two guard rings 25.

The semiconductor device 1 may be provided with p-type guard rings 25 surrounding the diffusion layer 3 so as to have a high breakdown voltage, as shown in FIG. 7. The guard rings 25 are selectively formed at the upper surface 2a of the voltage supporting region B. The number of guard rings is not limited to two, but may be one, or three or more. If a conductor portion is disposed above the guard rings 25, the conductor portion is connected to the overvoltage protection diode 5 at a portion deformed toward a high potential side.

Figure 8:
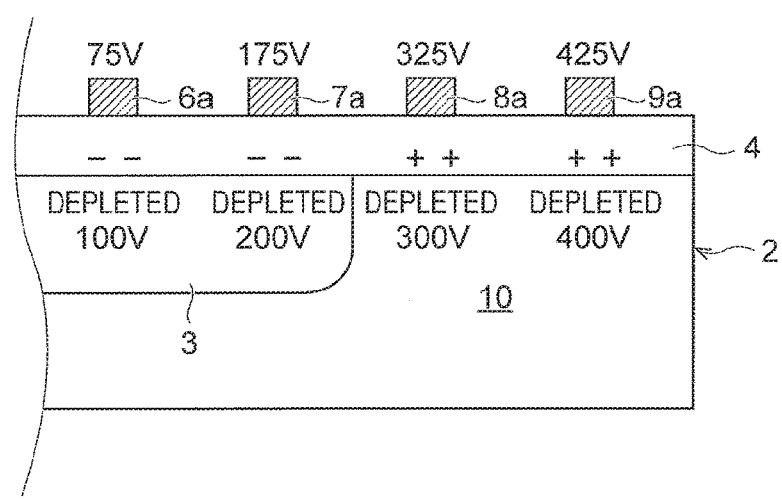
FIG. 8 is a diagram showing an example of a potential in each region in the reverse bias application state, when the conductive type of a diffusion layer 3 is n-type, and the conductive type of a peripheral semiconductor region 10 is p-type.

The conductive type of each semiconductor region in the semiconductor device 1 may be opposite to the one described above. Specifically, the diffusion layer 3 may be of n-type, and the peripheral semiconductor region 10 may be of p-type. In this case, the ends of the conductor portions 6 and 7 are electrically connected to the first portion on the side surface of the overvoltage protection diode 5 so that the potential of the conductor portions 6 and 7 is lower than the potential of the diffusion layer 3 immediately below the conductor portions 6 and 7 in the reverse bias application state, as shown in FIG. 8. Similarly, the ends of the conductor portions 8 and 9 are electrically connected to the second portion on the side surface of the overvoltage protection diode 5 so that the potential of the conductor portions 8 and 9 is higher than the potential of the peripheral semiconductor region 10 immediately below the conductor portions 8 and 9 in the reverse bias application state. This means that the conductor forming portions 6c, 7c, 8c, and 9c are located to be away from the pn junction boundary P1.

Therefore, generally speaking, the conductor portion located above the p-type semiconductor region is electrically connected to the overvoltage protection diode 5 at a portion deformed toward the high potential side, and the conductor portion located above the n-type semiconductor region is electrically connected to a portion of the overvoltage protection diode 5 at a portion deformed toward the low potential side. As a result, depletion occurs in the surface portion of the semiconductor region located below the conductor portions in the reverse bias application state.

As described above, in this embodiment, the potential of the conductor portions 6, 7, 8, and 9 is controlled so that depletion occurs in the peripheral semiconductor region 10 in portions near the insulating film 4 by changing the connections of the conductor portions 6, 7, 8, and 9 to the overvoltage protection diode 5 in accordance with the conductive types of the semiconductor layers located immediately below. As a result, the movement of the mobile ions in the insulating film 4 may be sufficiently inhibited.

Figure 10:
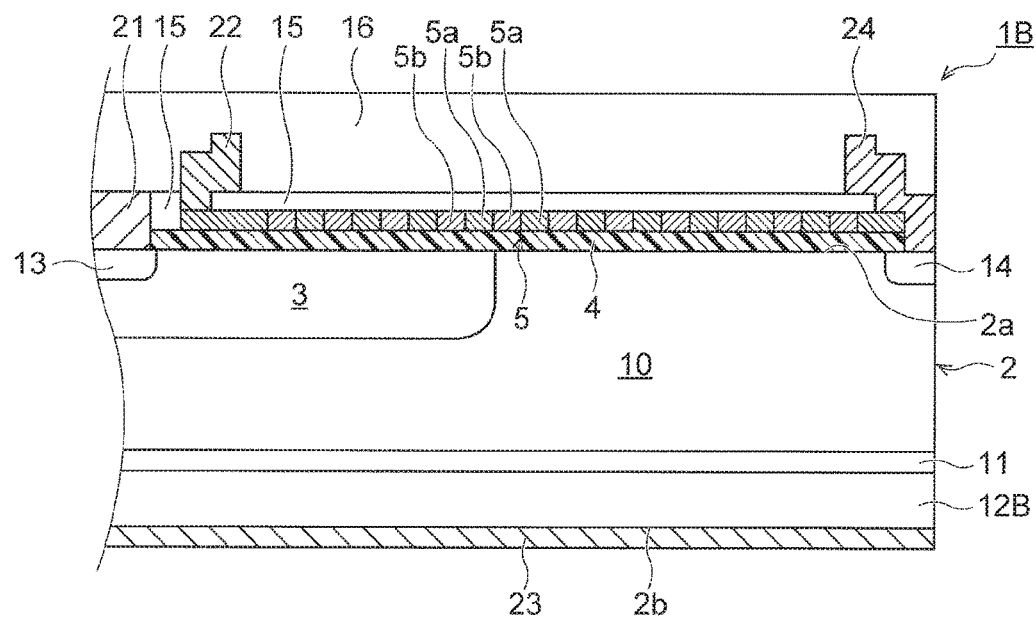
FIG. 10 is a cross-sectional view of a semiconductor device 1B (IGBT) according to a modification of the first embodiment.

The configuration of the IGBT is not limited to that of the semiconductor device 1 described above. For example, a semiconductor device 1B according to a modification includes an n-type drain region 12B instead of the p-type collector region 12 as shown in FIG. 10, and a collector electrode 23 that makes a Schottky barrier with the drain region 12B. In this case, the collector electrode 23 includes a barrier metal such as platinum or molybdenum.

Second Embodiment

Figure 9:
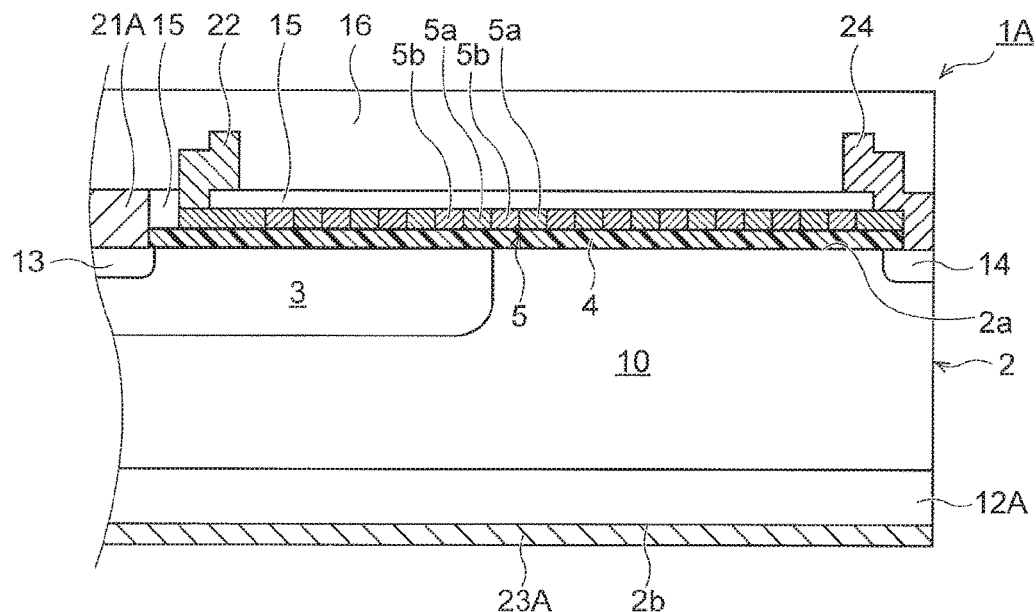
FIG. 9 is a cross-sectional view of a semiconductor device 1A (vertical MOSFET) according to a second embodiment.

Next, a second embodiment of the present invention will be described. A semiconductor device 1A according to the second embodiment is a vertical MOSFET. The plan view of the semiconductor device 1A is the same as FIG. 1. FIG. 9 is a cross-sectional view of the semiconductor device 1A, which corresponds to FIG. 2 described in the descriptions of the first embodiment. In FIG. 9, the elements common to those of the first embodiment have the same reference numerals. In the following descriptions, differences between the first embodiment and the second embodiment will be mainly described.

The semiconductor device 1A includes a p-type diffusion layer 3, an insulating film 4, an overvoltage protection diode 5, conductor portions 6, 7, 8, and 9, an n-type drain region 12A, an n-type diffusion region 13, an n-type stopper region 14, a source electrode 21A, a gate electrode 22, a drain electrode 23A, and a stopper electrode 24. The drain region 12A is formed at a lower surface 2b of a semiconductor substrate 2, and a drain electrode 23A is formed on the drain region 12A. The source electrode 21A is formed on the diffusion region 13.

In the semiconductor device 1A, the ends of the conductor portions 6 and 7 are electrically connected to a side surface of the overvoltage protection diode 5 so that depletion occurs in the diffusion layer 3 in portions near the insulating film 4 in the reverse bias application state, and the ends of the conductor portions 8 and 9 are electrically connected to the side surface of the overvoltage protection diode 5 so that depletion occurs in the peripheral semiconductor region 10 in portions near the insulating film 4. In the second embodiment, the "reverse bias application state" means the state in which the drain electrode 23A is connected to a high potential (for example, the positive electrode of a DC power supply), the source electrode 21A is grounded, and a low voltage that does not turn on the vertical MOSFET is applied to the gate electrode 22.

The second embodiment provides functions similar to those of the first embodiment. Therefore, a semiconductor device 1A capable of inhibiting the reduction in the breakdown voltage and improving the reliability may be provided.

Based on the above description, those skilled in the art may imagine additional advantageous effects of the present invention and various modifications. However, the modes of the present invention are not limited to the individual embodiments described above. Configuration elements in different embodiments may be appropriately combined. Various types of addition, modification and partial deletion can be made within a range without departing from the conceptual thought and spirit of the present invention that can be derived from the content specified in the claims and equivalents thereof.

REFERENCE SIGNS LIST

1, 1A, 1B semiconductor device
2 semiconductor substrate
2a upper surface
2b lower surface
3 diffusion layer
4 insulating film
5 overvoltage protection diode
5a, 5b semiconductor layer
6, 7, 8, 9, 31, 32, 33, 34, 35 conductor portion
6a, 7a, 8a, 9a, 6b, 7b, 8b, 9b, 6c, 7c, 8c, 9c conductor forming portion
10 peripheral semiconductor region
11 buffer region
12 collector region
12A, 12B drain region
13 diffusion region
14 stopper region
15 insulating film
16 surface protecting film
21 emitter electrode
21A source electrode
22 gate electrode
23 collector electrode
23A drain electrode
24 stopper electrode
25 guard ring
A active region
B voltage supporting region
E1, E2 end point
P1, P2 boundary (of diffusion layer 3)
R region

The invention claimed is:

1. A semiconductor device in which a principal current flows between one principal surface and another principal surface of a semiconductor substrate, wherein:
the one principal surface of the semiconductor substrate includes an active region, and a voltage supporting region surrounding the active region and including a peripheral portion of the semiconductor substrate,
the semiconductor device comprising:
a diffusion layer of a second conductive type selectively formed on the one principal surface in the voltage supporting region, and surrounding the active region;
an insulating film formed on the diffusion layer, and on a peripheral semiconductor region of a first conductive type disposed outside the diffusion layer;
an overvoltage protection diode including semiconductor layers of the first conductive type and semiconductor layers of the second conductive type alternately disposed on the insulating film from an active region side toward the peripheral portion of the semiconductor substrate; and
a first conductor portion and a second conductor portion formed on the insulating film along the voltage supporting region,
the first conductor portion being disposed above the diffusion layer with the insulating film being disposed therebetween, and the second conductor portion being disposed above the peripheral semiconductor region with the insulating film being disposed therebetween,
an end of the first conductor portion being electrically connected to the overvoltage protection diode so that depletion occurs in the diffusion layer in a portion near the insulating film in a reverse bias application state, wherein:
the first conductive type is n-type and the second conductive type is p-type;
the end of the first conductor portion is electrically connected to a first portion of a side surface of the overvoltage protection diode so that a potential of the first conductor portion is higher than a potential of the diffusion layer immediately below the first conductor portion in the reverse bias application state; and an end of the second conductor portion is electrically connected to a second portion of the side surface of the overvoltage protection diode so that a potential of the second conductor portion is lower than a potential of the peripheral semiconductor region immediately below the second conductor portion in the reverse bias application state, wherein the first conductor portion includes:

a first conductor forming portion extending along the peripheral portion of the semiconductor substrate;

a second conductor forming portion extending to be close to the overvoltage protection diode, one end of the second conductor forming portion being connected to the first conductor forming portion; and a third conductor forming portion electrically connecting the second conductor forming portion and the overvoltage protection diode, the second conductor forming portion being wider than the first conductor forming portion, and the third conductor forming portion being narrower than a width at another end of the second conductor forming portion, and being disposed to shift toward a side end of the semiconductor substrate.

2. A semiconductor device in which a principal current flows between one principal surface and another principal surface of a semiconductor substrate, wherein:

the one principal surface of the semiconductor substrate includes an active region, and a voltage supporting region surrounding the active region and including a peripheral portion of the semiconductor substrate, the semiconductor device comprising:

a diffusion layer of a second conductive type selectively formed on the one principal surface in the voltage supporting region, and surrounding the active region;

an insulating film formed on the diffusion layer, and on a peripheral semiconductor region of a first conductive type disposed outside the diffusion layer;

an overvoltage protection diode including semiconductor layers of the first conductive type and semiconductor layers of the second conductive type alternately disposed on the insulating film from an active region side toward the peripheral portion of the semiconductor substrate; and a first conductor portion and a second conductor portion formed on the insulating film along the voltage supporting region, the first conductor portion being disposed above the diffusion layer with the insulating film being disposed therebetween, and the second conductor portion being disposed above the peripheral semiconductor region with the insulating film being disposed therebetween, an end of the first conductor portion being electrically connected to the overvoltage protection diode so that depletion occurs in the diffusion layer in a portion near the insulating film in a reverse bias application state, wherein:

the first conductive type is n-type and the second conductive type is p-type;

the end of the first conductor portion is electrically connected to a first portion of a side surface of the overvoltage protection diode so that a potential of the first conductor portion is higher than a potential of the diffusion layer immediately below the first conductor portion in the reverse bias application state; and an end of the second conductor portion is electrically connected to a second portion of the side surface of the overvoltage protection diode so that a potential of the second conductor portion is lower than a potential of the peripheral semiconductor region immediately below the second conductor portion in the reverse bias application state, wherein the second conductor portion includes:

a first conductor forming portion extending along the peripheral portion of the semiconductor substrate;

a second conductor forming portion extending to be close to the overvoltage protection diode, one end of the second conductor forming portion being connected to the first conductor forming portion; and a third conductor forming portion electrically connecting the second conductor forming portion and the overvoltage protection diode, the second conductor forming portion being wider than the first conductor forming portion, and the third conductor forming portion being narrower than a width at another end of the second conductor forming portion, and being disposed to shift toward the active region side.

3. The semiconductor device according to claim 1, wherein the second conductor forming portion increases in width toward the overvoltage protection diode.

4. A semiconductor device in which a principal current flows between one principal surface and another principal surface of a semiconductor substrate, wherein:

the one principal surface of the semiconductor substrate includes an active region, and a voltage supporting region surrounding the active region and including a peripheral portion of the semiconductor substrate, the semiconductor device comprising:

a diffusion layer of a second conductive type selectively formed on the one principal surface in the voltage supporting region, and surrounding the active region;

an insulating film formed on the diffusion layer, and on a peripheral semiconductor region of a first conductive type disposed outside the diffusion layer;

an overvoltage protection diode including semiconductor layers of the first conductive type and semiconductor layers of the second conductive type alternately disposed on the insulating film from an active region side toward the peripheral portion of the semiconductor substrate; and a first conductor portion and a second conductor portion formed on the insulating film along the voltage supporting region, the first conductor portion being disposed above the diffusion layer with the insulating film being disposed therebetween, and the second conductor portion being disposed above the peripheral semiconductor region with the insulating film being disposed therebetween, an end of the first conductor portion being electrically connected to the overvoltage protection diode so that depletion occurs in the diffusion layer in a portion near the insulating film in a reverse bias application state, wherein:

the first conductive type is p-type and the second conductive type is n-type, the end of the first conductor portion is electrically connected to a first portion on a side surface of the overvoltage protection diode so that a potential of the first conductor portion is lower than a potential of the diffusion layer immediately below the first conductor portion in the reverse bias application state; and an end of the second conductor portion is electrically connected to a second portion of the side surface of the overvoltage protection diode so that a potential of the second conductor portion is higher than a potential of the peripheral semiconductor region immediately below the second conductor portion in the reverse bias application state, wherein the first conductor portion includes:

a first conductor forming portion extending along the peripheral portion of the semiconductor substrate;

a second conductor forming portion extending to be close to the overvoltage protection diode, one end of the second conductor forming portion being connected to the first conductor forming portion; and a third conductor forming portion electrically connecting the second conductor forming portion and the overvoltage protection diode, the second conductor forming portion being wider than the first conductor forming portion, and the third conductor forming portion being narrower than a width at another end of the second conductor forming portion, and being disposed to shift toward the active region side.

5. The semiconductor device according to claim 4, wherein the second conductor portion includes:

a fourth conductor forming portion extending along the peripheral portion of the semiconductor substrate;

a fifth conductor forming portion extending to be close to the overvoltage protection diode, one end of the fifth conductor forming portion being connected to the fourth conductor forming portion; and a sixth conductor forming portion electrically connecting the fifth conductor forming portion and the overvoltage protection diode, the second conductor forming portion being wider than the first conductor forming portion, and the third conductor forming portion being narrower than a width at another end of the second conductor forming portion, and being disposed to shift toward a side end of the semiconductor substrate.

6. The semiconductor device according to claim 4, wherein the second conductor forming portion increases in width toward the overvoltage protection diode.

7. The semiconductor device according to claim 1, wherein the semiconductor substrate is a silicon substrate, and the insulating film is a silicon oxide film.

8. The semiconductor device according to claim 1, wherein the first conductor portion and/or the second conductor portion are/is connected to the overvoltage protection diode over a connection boundary between the semiconductor layer of the first conductive type and the semiconductor layer of the second conductive type, which are adjacent to each other.

9. The semiconductor device according to claim 1, further comprising:

a diffusion region of the first conductive type formed in the diffusion layer;

an emitter electrode formed on the diffusion region;

a gate electrode formed on the overvoltage protection diode;

a collector region of the second conductive type formed on the other principal surface of the semiconductor substrate; and a collector electrode formed on the collector region.

10. The semiconductor device according to claim 1, further comprising:

a diffusion region of the first conductive type formed in the diffusion layer;

an emitter electrode formed on the diffusion region;

a gate electrode formed on the overvoltage protection diode;

a drain region of the first conductive type formed on the other principal surface of the semiconductor substrate; and a collector electrode formed on the drain region to form a Schottky barrier with the drain region.

11. The semiconductor device according to claim 1, further comprising:

a diffusion region of the first conductive type formed in the diffusion layer;

a source electrode formed on the diffusion region;

a gate electrode formed on the overvoltage protection diode;

a drain region of the first conductive type formed on the other principal surface of the semiconductor substrate; and a drain electrode formed on the drain region.

12. The semiconductor device according to claim 1, further comprising one or more guard rings of the second conductive type selectively formed on the one principal surface in the voltage supporting region to surround the diffusion layer.

* * * * *